(12) United States Patent
Loscutoff et al.

(10) Patent No.: US 11,127,871 B2
(45) Date of Patent: Sep. 21, 2021

(54) STRUCTURES AND METHODS FOR FORMING ELECTRODES OF SOLAR CELLS

(71) Applicant: SunPower Corporation, San Jose, CA (US)

(72) Inventors: Paul W. Loscutoff, Castro Valley, CA (US); Hung-Ming Wang, San Jose, CA (US); Matthew J. Dawson, Menlo Park, CA (US); Mark A. Kleshock, Phoenix, AZ (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 16/653,492

(22) Filed: Oct. 15, 2019

(65) Prior Publication Data

US 2020/0127150 A1 Apr. 23, 2020

Related U.S. Application Data

(60) Provisional application No. 62/746,682, filed on Oct. 17, 2018.

(51) Int. Cl.
*H01L 31/05* (2014.01)
*H01L 25/04* (2014.01)
*H01L 31/18* (2006.01)

(52) U.S. Cl.
CPC ............ *H01L 31/05* (2013.01); *H01L 25/042* (2013.01); *H01L 31/186* (2013.01); *H01L 31/1876* (2013.01)

(58) Field of Classification Search
CPC .................................................. H01L 31/1876
See application file for complete search history.

(56) References Cited

U.S. PATENT DOCUMENTS

| | | | |
|---|---|---|---|
| 7,455,787 B2 | 11/2008 | Rose et al. | |
| 8,029,683 B2 | 10/2011 | Rose et al. | |
| 8,322,300 B2 | 12/2012 | Pavani et al. | |
| 8,662,008 B2 | 3/2014 | Abas et al. | |
| 8,945,978 B2 | 2/2015 | Behnke | |
| 8,962,082 B2 | 2/2015 | Pavani et al. | |
| 9,064,686 B2 | 6/2015 | George et al. | |
| 9,293,624 B2 | 3/2016 | Cudzinovic et al. | |
| 9,328,427 B2 | 5/2016 | Behnke | |
| 9,553,229 B2 | 1/2017 | Rose et al. | |
| 9,640,676 B2 | 5/2017 | Stone | |
| 9,716,023 B2 | 7/2017 | Farrens et al. | |
| 2009/0039312 A1 | 2/2009 | Rose et al. | |
| 2011/0281439 A1 | 11/2011 | Ruatta et al. | |
| 2017/0077343 A1* | 3/2017 | Morad | H02S 40/34 |
| 2017/0162728 A1 | 6/2017 | Rose et al. | |
| 2019/0044006 A1 | 2/2019 | Rose et al. | |

FOREIGN PATENT DOCUMENTS

CN 107968049 A 4/2018

* cited by examiner

*Primary Examiner* — Yu-Hsi D Sun
(74) *Attorney, Agent, or Firm* — Patrick D. Benedicto (57) ABSTRACT

Solar cells are attached together to form a plating assembly. The plating assembly is attached to a belt, which transports the plating assembly through a plating chamber where metal is electroplated on the solar cells. The electroplated metal is patterned to form metal contact fingers. After the metal is electroplated, the plating assembly is singulated to separate the two solar cells.

16 Claims, 8 Drawing Sheets

STRUCTURES AND METHODS FOR FORMING ELECTRODES OF SOLAR CELLS

CROSS-REFERENCE TO RELATED APPLICATION

This application claims the benefit of U.S. Provisional Application No. 62/746,682, filed on Oct. 17, 2018, which is incorporated herein by reference in its entirety.

TECHNICAL FIELD

Embodiments of the subject matter described herein relate generally to solar cells. More particularly, embodiments of the subject matter relate to solar cell fabrication processes and structures.

BACKGROUND

Solar cells are well known devices for converting solar radiation to electrical energy. A solar cell has a front side that faces the sun during normal operation to collect solar radiation and a back side opposite the front side. Solar radiation impinging on the solar cell creates electrical charges that may be harnessed to power an external electrical circuit, such as a load.

Solar cell fabrication includes a metallization process, which involves forming electrodes that connect to corresponding doped regions of the solar cell. The electrodes may be formed by electroplating. Embodiments of the present invention provide improvements to existing solar cell electroplating processes and structures.

BRIEF SUMMARY

In one embodiment, a method of forming electrodes of solar cells includes applying a bonding agent on a first side of a first solar cell. The first side of the first solar cell is attached to a first side of a second solar cell to form a plating assembly. The plating assembly is passed through a plating chamber to electroplate metal on a second side of the first solar cell and on a second side of the second solar cell of the plating assembly. The plating assembly is singulated to separate the first solar cell from and the second solar cell.

In one embodiment, an article of manufacture comprises a first solar cell and a second solar cell, each of the first and second solar cells having a front side that faces the sun during normal operation and a back side that is opposite the front side. A bonding agent is disposed between the front side of the first solar cell and the front side of the second solar cell.

In one embodiment, a method of forming electrodes of solar cells includes forming a plating assembly by attaching a first solar cell to a second solar cell. The plating assembly is attached to a belt of a plating tool. The belt of the plating tool is moved to transport the plating assembly through a plating chamber and electroplate metal on the first solar cell and on the second solar cell of the plating assembly. The first solar cell is separated from the second solar cell.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
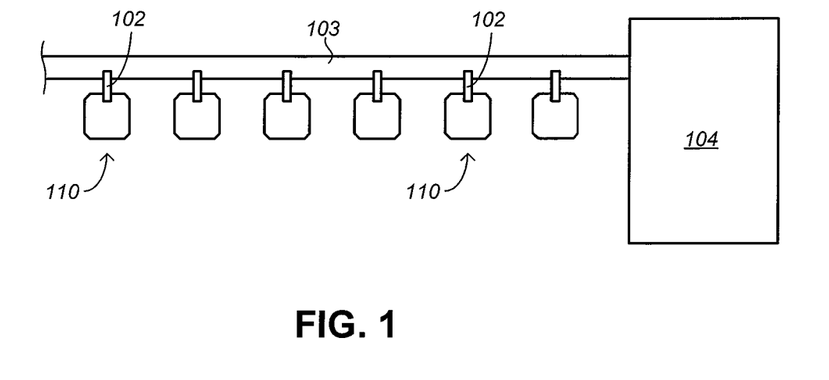
FIG. 1 is a block diagram of a solar cell electroplating station in accordance with an embodiment of the present invention.

FIG. 1 is a block diagram of a solar cell electroplating station in accordance with an embodiment of the present invention. In the example of FIG. 1, a plating assembly 110 comprises two solar cells that are attached together, such as by a bonding agent. Each plating assembly 110 is held by an electrically conductive clip 102, which in turn is attached to a continuous belt 103. Only some of the plating assemblies 110 and clips 102 are labeled in FIG. 1 for clarity of illustration.

In the example of FIG. 1, a clip 102 provides electrical connection to its corresponding plating assembly 110. The continuous belt 103 carries the plating assemblies 110 through a plating chamber 104, where metal is electroplated onto the solar cells of the plating assemblies 110. The belt 103, the clips 110, and the plating chamber 104 may be part of a conventional plating tool, such as those commercially available from the Meco Equipment Engineers company of the Netherlands. Other suitable plating tools may also be employed without detracting from the merits of the present invention. In one embodiment, the plating tool is jig-less. That is, a plating assembly 110 is only held by a clip 102, instead of being held by a jig that is attached to the belt 103.

Figure 2:
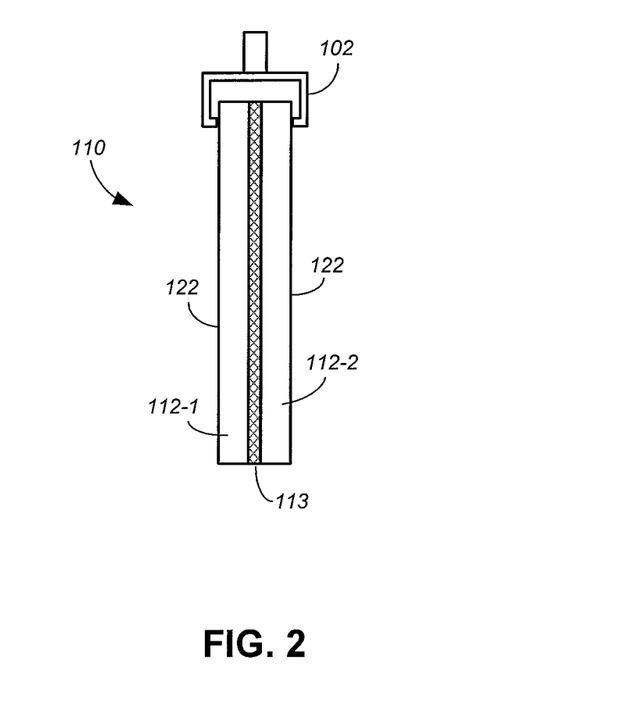
FIG. 2 is an edge view of a plating assembly in accordance with an embodiment of the present invention.

FIG. 2 is an edge view of a plating assembly 110 in accordance with an embodiment of the present invention. In the example of FIG. 2, the plating assembly 110 comprises a pair of solar cells 112 (i.e., 112-1, 112-2) that are attached together by a layer of a bonding agent 113. More particularly, to form the plating assembly 110, a solar cell 112-1 is bonded to a solar cell 112-2 using a bonding agent 113. The bonding agent 113 may be applied completely or partially on a surface of one or both of the solar cells 112-1 and 112-2. A clip 102 not only holds a plating assembly 110 for transport through the plating chamber 104, but is also electrically conductive to allow electrical current to flow to the plating assembly 110 for electroplating. Electroplating, in general, is a well-known process and not further described herein.

Generally speaking, a solar cell has a front side that faces the sun during normal operation and a back side that is opposite the front side. In one embodiment, in the plating assembly 110, the front sides of the solar cells 112-1 and 112-2 face towards the bonding agent 113. The back sides 122 of the solar cells 112-1 and 112-2 face away from the bonding agent 113, and are exposed during the electroplating process to allow electroplating of copper or other metal thereon.

FIGS. 3-10 schematically illustrate a method of forming electrodes of solar cells in accordance with an embodiment of the present invention.

Figure 3:
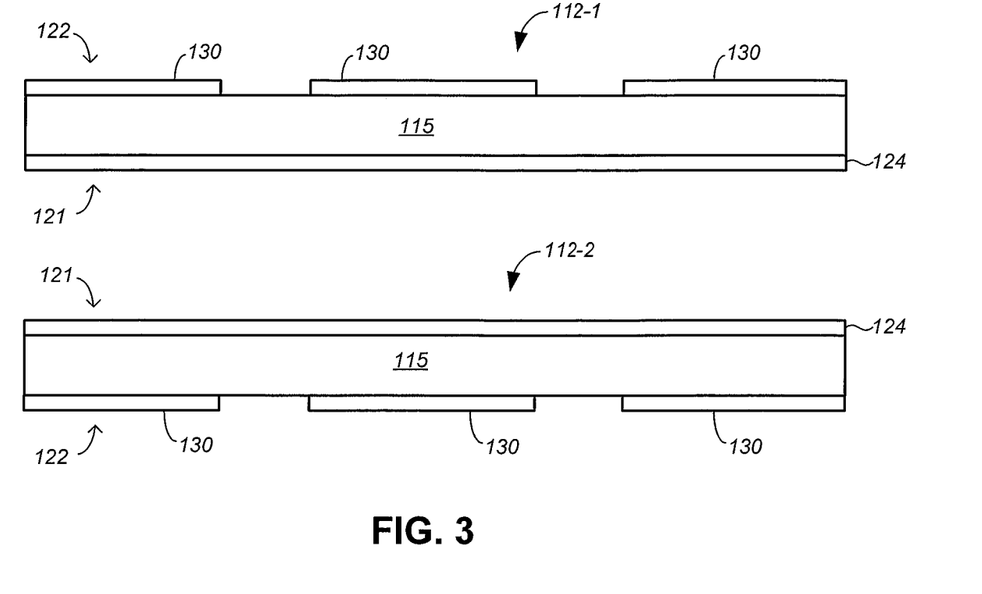
FIGS. 3-10 schematically illustrate a method of forming electrodes of solar cells in accordance with an embodiment of the present invention.

In the example of FIG. 3, a solar cell 112 comprises a substrate 115 (e.g., silicon wafer). A dielectric surface 124, which is formed on the substrate 115, is disposed on the front side 121 of a solar cell 112. The dielectric surface 124 may comprise one or more layers of dielectric material, such as a layer of anti-reflective coating (e.g., silicon nitride) or other dielectric. Formed on or within the substrate 115 are doped regions and other layers of a solar cell 112, which are not shown for clarity of illustration. These doped regions and other layers may be formed using conventional processes without detracting from the merits of the present invention. In one embodiment, a solar cell 112 is an all backside contact solar cell, wherein all electrical connections to the doped regions of the solar cell 112 are made from the back side 122. In the example of FIG. 3, a solar cell 112-1 and a solar cell 112-2 are subsequently formed into a plating assembly 110 to form electrodes on their corresponding back sides 122.

In one embodiment, a patterning process includes formation of a plating mask 130 on a back side 122 and a subsequent etch back process that removes the plating mask 130 after electroplating. The etch back process may also remove a plating seed layer (not shown) on the back side 122 that is covered by the plating mask 130. A plating mask 130 may comprise a resist ink, for example. The plating mask 130 defines where metal is to be electroplated on the back side 122. In the example of FIG. 3, for simplicity of the process, the plating mask 130 is formed before the solar cells 112-1 and 112-2 are bonded together to form a plating assembly 110. The plating mask 130 may also be formed after the solar cells 112-1 and 112-2 have been bonded together, depending on process particulars.

Figure 4:
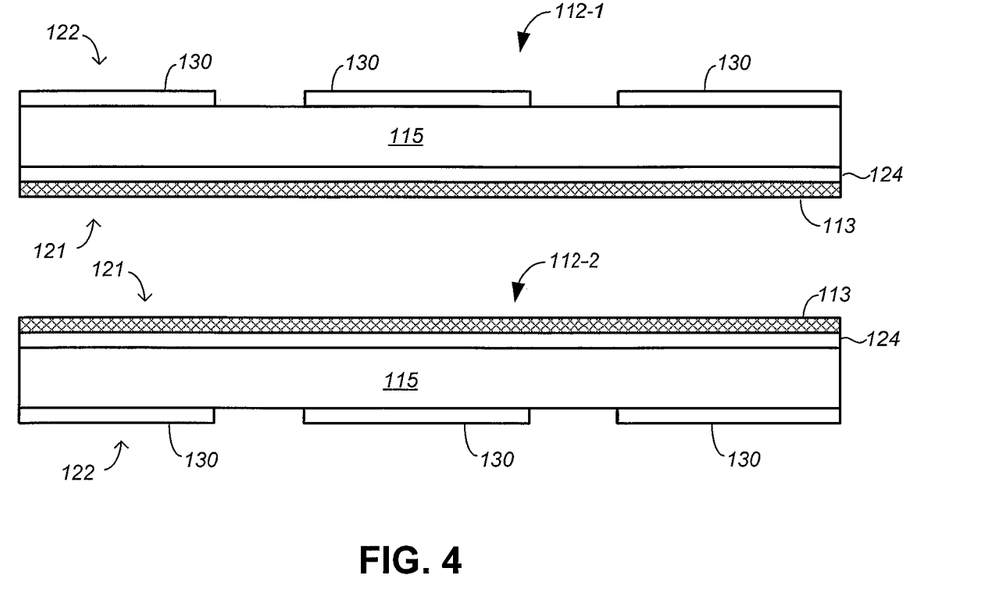

In the example of FIG. 4, a bonding agent 113 is applied on a front side 121 of each of the solar cells 112-1 and 112-2. In other embodiments, a bonding agent 113 is applied on a front side 121 of either the solar cell 112-1 or 112-2. A bonding agent 113 may be applied directly on a dielectric surface 124 or other topmost surface on a front side 121.

Figure 5:
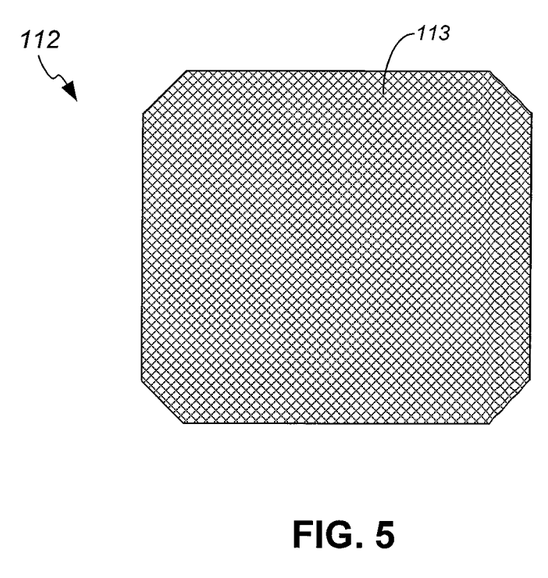

In a so-called full-surface print, a bonding agent 113 is applied on an entire surface of a front side 121. FIG. 5 is a front side view of a solar cell 112, showing a full-surface print of a bonding agent 113 on a front side 121 in accordance with an embodiment of the present invention.

Figure 6:
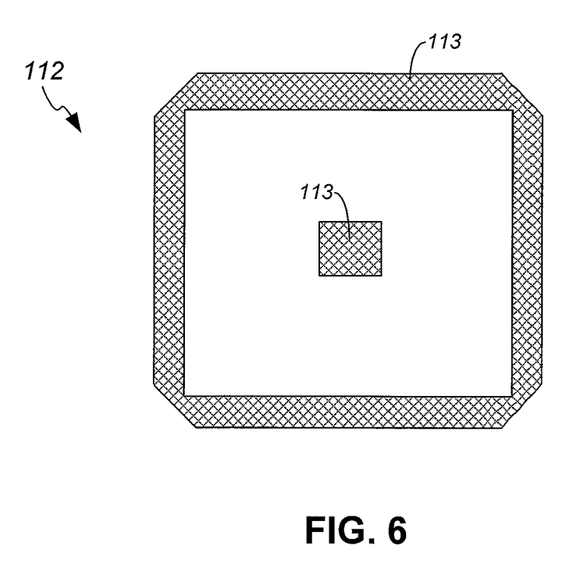

In a so-called partial-surface print, a bonding agent 113 is applied only on certain areas of a front side 121. FIG. 6 is a front side view of a solar cell 112, showing a partial-surface print of a bonding agent 113 on a front side 121 in accordance with an embodiment of the present invention. In the example of FIG. 6, the bonding agent 113 is applied on a limited area around the rim of a front side 121 and on a limited area on the center of the front side 121. More particularly, the bonding agent 113 is applied on the rim, but not an entire surface, of the front side 121.

A bonding agent 113 may comprise an ink, such as a resist ink or edge coat ink. For example, a bonding agent 113 may be a conventional resist material, such as an edge coat ink or resist ink commercially-available from Sun Chemical Corporation. To form a plating assembly 110, the front sides 121 of the solar cells 112-1 and 112-2 may be edge coated together or pressed together after ink coating but before ink curing. Commonly-assigned U.S. Pat. Nos. 8,662,008, 8,322,300, 8,962,082, and 9,640,676, which are incorporated herein by reference in their entirety, disclose suitable edge coating processes and tools.

As another example, a bonding agent 113 may comprise a wax, such as a hot melt resist wax or an adhesive wax typically used in semiconductor wafer dicing. Yet another example, a bonding agent 113 may comprise a conventional non-permanent adhesive, either aerosol spray or liquid deposited. Other suitable bonding agents that are compatible with electroplating may also be employed.

Another mechanism to bond the solar cells 112-1 and 112-2 can be the use of a high surface tension liquid, such as water, as a bonding agent 113. When a small volume of liquid is squeezed between the solar cells 112-1 and 112-2, the capillary forces of the liquid in the narrow space can hold the solar cells 112-1 and 112-2 together. The use of a high surface tension liquid as a bonding agent 113 may be implemented alone, or in conjunction with another bonding method, such as an edge coat or edge seal with resist. An advantage of a liquid bonding agent is that singulation, i.e., de-bonding, can be accomplished by simply heating the liquid above its boiling point or by sliding or shearing the two solar cells apart.

A bonding agent 113 may be applied by roll coating, screen-printing, inkjet printing, aerosol spray, drop coating, tape application, or any other suitable bonding agent application process.

Figure 7:
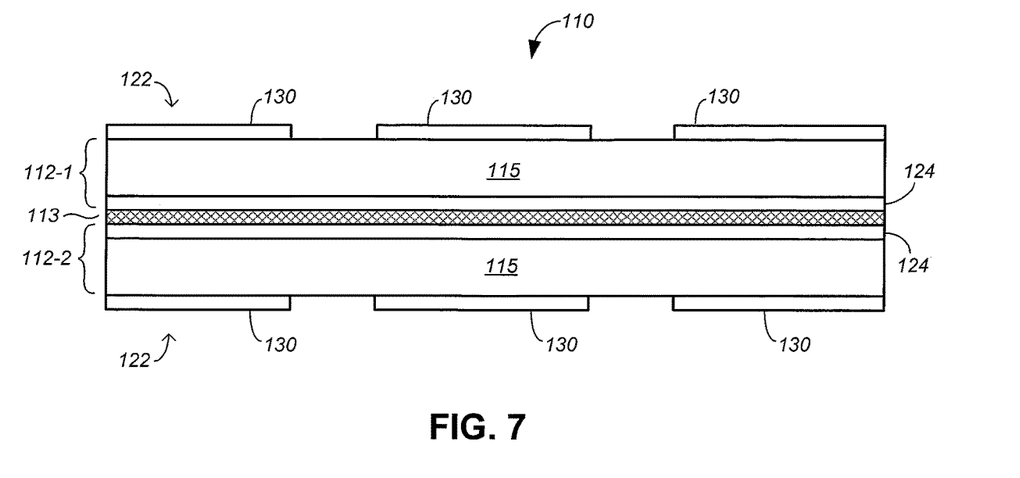

Continuing with the example of FIG. 7, the solar cells 112-1 and 112-2 are attached together, with the bonding agent 113 between them, to form the plating assembly 110. In the example of FIG. 7, the bonding agent 113 bonds together the dielectric surfaces 124 of the solar cells 112-1 and 112-2. The plating assembly 110 allows the solar cells 112-1 and 112-2 to undergo electroplating as a single assembly. That is, the solar cells 112-1 and 112-2 may be handled and processed as if the solar cells 112-1 and 112-2 are a single wafer. This allows electroplating of the solar cells 112-1 and 112-2 at the same time in plating tools that are designed for individual solar cells or conventional electroplating.

Figure 8:
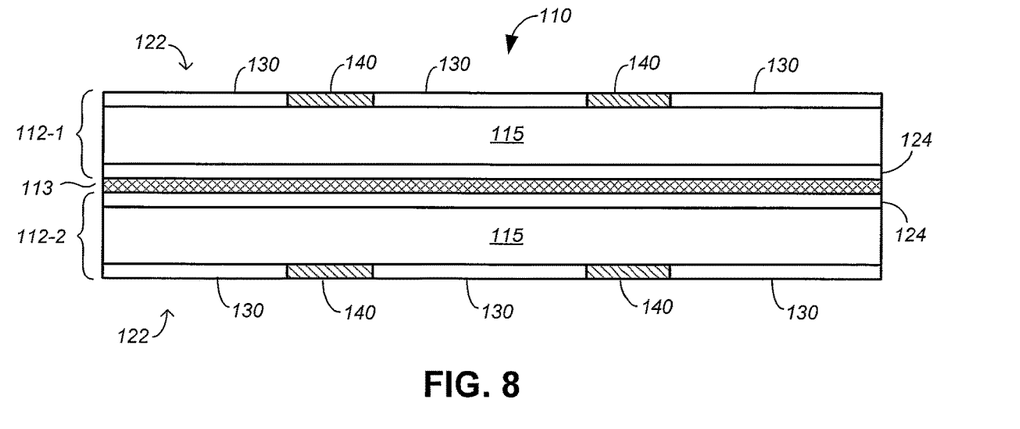

In the example of FIG. 8, the plating assembly 110 undergoes electroplating in the plating chamber of the plating tool to form a metal layer 140 on exposed areas of a back side 122 of each of the solar cells 112-1 and 112-2. In one embodiment, the electroplating process electroplates copper on the back sides 122 of the solar cells 112-1 and 112-2. That is, the metal layer 140 may comprise copper. Other metals may also be electroplated without detracting from the merits of the present invention.

The plating assembly 110 provides many advantages heretofore unrealized. First, the plating assembly 110 increases the mechanical stability of the solar cells 112-1 and 112-2 during electroplating because the plating assembly 110, in effect, forms a single, thick wafer. Second, the plating assembly 110 minimizes warping caused by the electroplated metals, because a warp on the solar cell 112-1 is balanced by an opposing warp on the solar cell 112-2. Third, the plating assembly 110 reduces chemical drag out because of the reduced free surface area per solar cell 112 during electroplating. Fourth, the plating assembly 110 increases the throughput of the plating tool by allowing two solar cells 112 to be electroplated per clip 102. Fifth, the plating assembly 110 does not necessarily require a plating jig to electroplate more than one solar cell 112 per clip 102.

Figure 9:
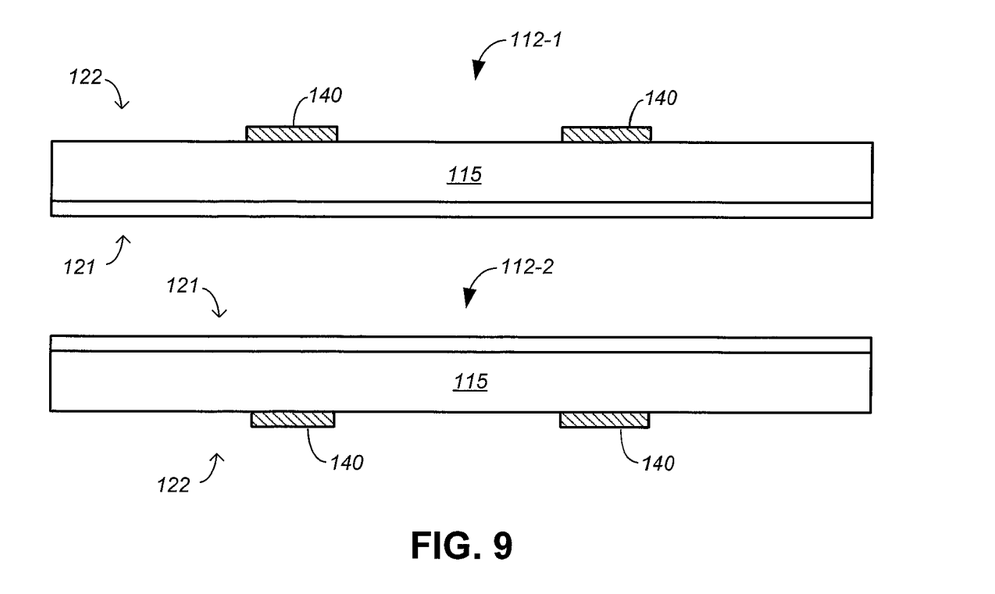

In the example of FIG. 9, a singulation process is performed on the plating assembly 110 to separate the solar cells 112-1 and 112-2. The singulation process removes the bonding agent 113 from the front sides 121, so that the solar cells 112-1 and 112-2 may be detached from each other. The singulation process depends on the bonding agent 113 employed, and may be a thermal or chemical process. For example, a chemical dip may be employed to remove an edge coat ink, a resist ink or a combination thereof. As another example, a bonding agent 113 that is temperature-sensitive (e.g., hot melt ink, thermal tape) may be heated to peel or slide apart the solar cells 112-1 and 112-2. The singulation process may be performed as part of the etch back process that removes the plating mask 130.

In one embodiment, the singulation process is performed before a final patterning of the metal layer 140, i.e., before the etch back process. In this embodiment, the solar cells 112-1 and 112-2 are separated, individual solar cells during etch back. Any residue left over after the singulation process may be cleaned in the etchback tool, such as in an ink strip bath or other module designed for cleaning the bonding agent 113.

To increase the throughput of the etchback tool, the singulation process may also be performed after the final patterning of the metal layer 140. That is, etch back may be performed on the plating assembly 110 after electroplating but before singulation. After etch back of the metal layer 140 to form interdigitated metal contact fingers, singulation is performed on the plating assembly 110 to separate the solar cells 112-1 and 112-2.

Figure 10:
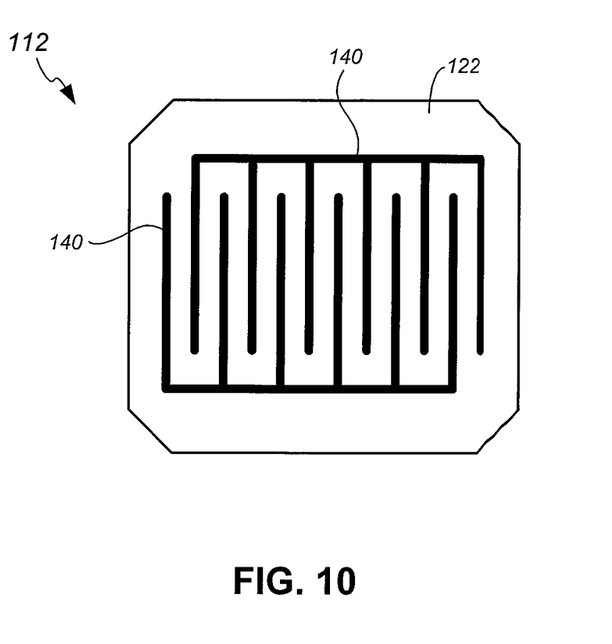

FIG. 10 is a back side view of a solar cell 112 in accordance with an embodiment of the present invention. In the example of FIG. 10, the metal layer 140 electroplated on a back side 122 forms interdigitated metal contact fingers. Each metal contact finger is electrically connected to a corresponding doped region of a solar cell 112.

In a first experiment, a bonding agent 113 comprising a thermal cure resist ink was full-surface printed on a front side 121 of each of the solar cells 112-1 and 112-2. The front sides 121 of the solar cells 112-1 and 112-2 were thereafter pressed together in alignment; the still wet resist ink held the solar cells 112-1 and 112-2 together as an intermediate step prior to thermal curing. The resist ink was relatively thick, and did not exhibit visible signs of wicking. While the solar cells 112-1 and 112-2 were held together by the still wet resist ink, the solar cells 112-1 and 112-2 were heated for about 10-20 minutes at 140° C. to cure the resist ink and thereby form a plating assembly 110. The plating assembly 110 was electroplated. Singulation to separate the solar cells 112-1 and 112-2 was thereafter performed using a chemical submersion in potassium hydroxide (KOH). The KOH also stripped the plating mask as part of an etch back process. No degradation of the solar cells 112-1 and 112-2 due to the electroplating was detected.

In a second experiment, a bonding agent 113 comprising hot melt ink was full-surface printed on a front side 121 of each of the solar cells 112-1 and 112-2. The front sides 121 of the solar cells 112-1 and 112-2 were pressed together in alignment, with the hot melt ink still frozen as a wax at room temperature. The solar cells 112-1 and 112-2 were thereafter heated on a hot plate at around a 80° C. setpoint, thereby melting the hot melt ink to wick and flow between the front sides 121 of the solar cells 112-1 and 112-2. The solar cells 112-1 and 112-2 were then removed from the hot plate, thereby allowing the hot melt ink to re-freeze and bond the solar cells 112-1 and 112-2 together as a plating assembly 110. Singulation was performed by heating the plating assembly 110 to melt the hot melt ink and allow the solar cells 112-1 and 112-2 to be peeled apart.

In a third experiment, a bonding agent 113 comprising hot melt ink was printed only on a rim on a front side 121 of each of the solar cells 112-1 and 112-2. The solar cells 112-1 and 112-2 were then processed as in the second experiment. The plating assemblies 110 in the second and third experiments were not subjected to electroplating. However, the second and third experiments proved the mechanical stability and general suitability of bonding the solar cells 112-1 and 112-2 using hot melt ink.

Figure 11:
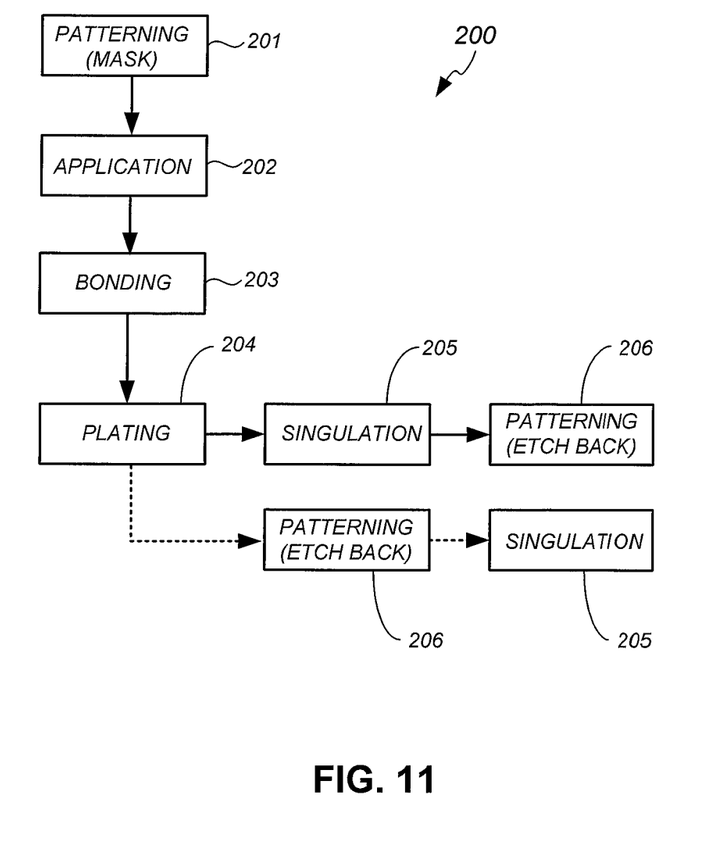
FIG. 11 is a block diagram of a solar cell metallization line in accordance with an embodiment of the present invention.

FIG. 11 is a block diagram of a solar cell metallization line 200 in accordance with an embodiment of the present invention. The metallization line 200 may be incorporated in a solar cell fabrication facility to form electrodes on solar cells. In one embodiment, the metallization line 200 has production stations 201-206.

In one embodiment, a patterning process to form electrodes of a solar cell includes an initial patterning step of forming a plating mask in a masking station 201 and a final patterning step of isolating the electrode in an etch back process performed in an etch back station 206. The masking station 201 may include printing tools (e.g., printer, print screen, roller), and the etch back station 206 may include an etch back tool. In the masking station 201, a plating mask is formed on the back side of each of the solar cells of the plating assembly prior to electroplating. In the example of FIG. 11, the plating mask is formed before the solar cells are formed into a plating assembly, such as before the solar cells are received in an application station 202.

Solar cells that are ready for metallization are received in the application station 202. The solar cells already have doped regions as received in the application station 202. In the application station 202, the bonding agent is applied on the solar cells. The application station 202 may include a print screen, printer, rollers, and/or other tool for applying the bonding agent on a surface of a solar cell.

In the bonding station 203, the solar cells are bonded together to form a plating assembly. The bonding station 203 may include an alignment jig for positioning the two the solar cells, a hot plate, and/or other tool for attaching the front sides of the solar cells together.

In the electroplating station 204, metal is electroplated on back sides of the solar cells of the plating assembly. The electroplating station 204 may include a plating tool that has a plating chamber, a clip that holds the plating assembly, and a continuous belt that runs the clip/plating assembly through the plating chamber.

In the singulation station 205, the plating assembly is singulated to separate the solar cells of the plating assembly. The singulation station may include a hot plate, chemical bath, and/or other tool that is configured to remove the particular bonding agent employed.

In the etch back station 206, the metal that has been electroplated on the solar cells is formed into metal contact fingers that electrically connect to corresponding doped regions. The etch back station 206 may include an etchback tool, for example. The etch back process performed in the patterning station 206 may also be configured to clean the surface of the solar cell and remove remaining residue from the bonding agent.

As noted by dashed lines in FIG. 11, the plating assembly may be passed through the singulation and etch back stations in a different order. More particularly, etch back may be performed before singulation. That is, the plating assembly may be etched back in the etch back station 206 while the solar cells are still attached together as a single assembly. Thereafter, the plating assembly may be singulated in the singulation station 204 to separate the solar cells.

The production stations 201-206 are described above as individual stations, but may also be implemented as built-in modules of a plating system. For example, the metallization line 200 may include a plating system with integrated, in-line plating module, singulation module, and etch back module, etc. Solar cells may be processed through the plating system in-situ, i.e., in one loading into the plating system. Solar cells may be transported from one module to another in the plating system by robotic arms or other automated wafer transport.

Figure 12:
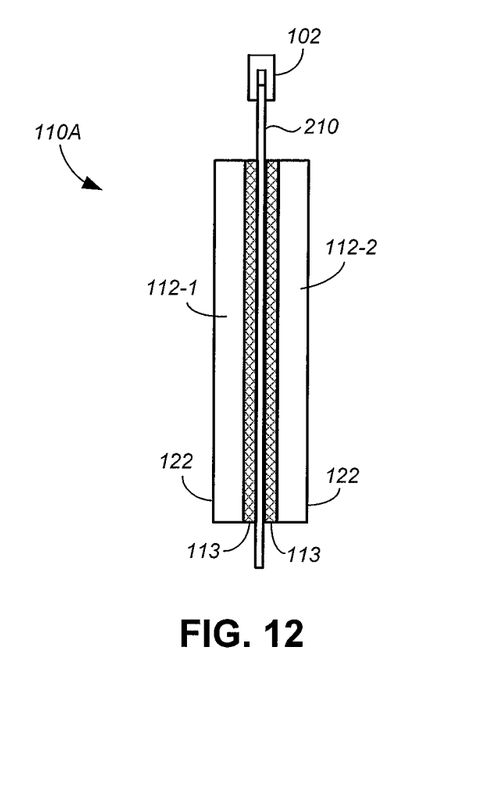
FIG. 12 is an edge view of a plating assembly in accordance with another embodiment of the present invention.

FIG. 12 is an edge view of a plating assembly 110A in accordance with an embodiment of the present invention. The plating assembly 110A is a particular embodiment of the plating assembly 110.

In the example of FIG. 12, a bonding agent 113 is applied on the front side surfaces of the solar cells 112-1 and 112-2. Instead of directly attaching the solar cells 112-1 and 112-2 together using the bonding agent 113, each of the solar cells 112-1 and 112-2 is attached to a plating sheet 210. The plating sheet 210 may comprise an electrically insulating material that is compatible with electroplating. For example, the plating sheet 210 may be a polymeric or plastic material, such as Chlorinated Poly (Vinyl Chloride) (CPVC), Polytetrafluoroethylene (PTFE), Polyvinylidene fluoride (PVDF), or other similar materials. The plating sheet 210 and the solar cells 112-1 and 112-2 form the plating assembly 110A, which may be passed through a plating tool as a single assembly as before. In the example of FIG. 12, the plating assembly 110A is held by a clip 102, which is attached to a continuous belt of the plating tool. Electrical wirings (not shown) connect the clip 102 to each of the solar cells 112-1 and 112-2.

Figure 13:
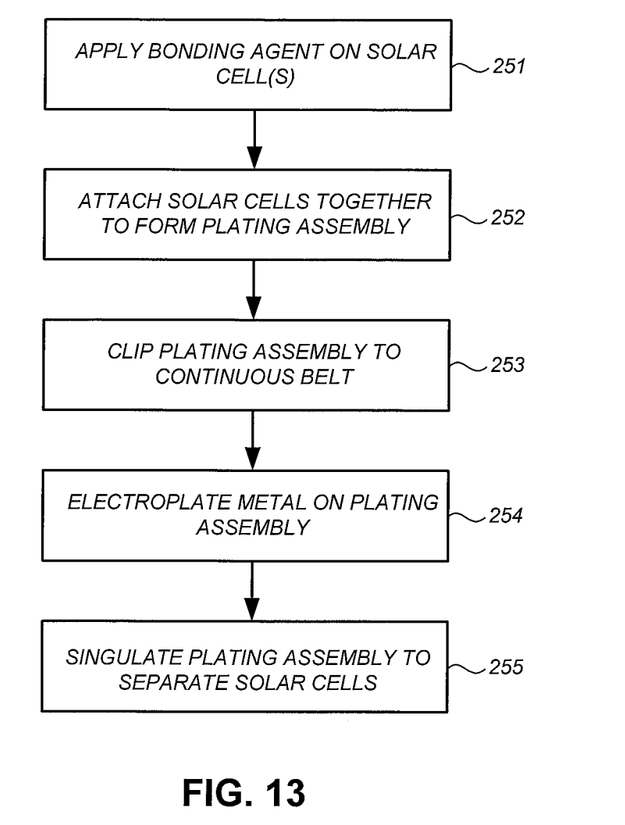
FIG. 13 is a flow diagram of a method of forming electrodes of solar cells in accordance with an embodiment of the present invention.

FIG. 13 is a flow diagram of a method of forming electrodes of solar cells in accordance with an embodiment of the present invention. The method of FIG. 13 is described using previously described components. As can be appreciated, other components may also be employed without detracting from the merits of the present invention.

In the example of FIG. 13, a bonding agent is applied on a front side surface of one or both solar cells being fabricated (step 251). The two solar cells are attached together, using the bonding agent, to form a plating assembly (step 252). The plating assembly is clipped to a continuous belt of a plating tool (step 253). The continuous belt transports the plating assembly through a plating chamber to electroplate metal on the back sides of the two solar cells of the plating assembly (step 254). The plating assembly is singulated to separate the two solar cells into individual solar cells (step 255).

Methods and structures for metallization of solar cells have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of forming electrodes of solar cells, the method comprising:
applying a bonding agent on a first side of a first solar cell;
attaching the first side of the first solar cell to a first side of a second solar cell to form a plating assembly;
passing the plating assembly through a plating chamber to electroplate metal on a second side of the first solar cell and on a second side of the second solar cell of the plating assembly; and
singulating the plating assembly to separate the first solar cell from and the second solar cell.

2. The method of claim 1, further comprising:
before attaching the first side of the first solar cell to the first side of the second solar cell to form the plating assembly, applying the bonding agent on the first side of the second solar cell.

3. The method of claim 1, wherein applying the bonding agent on the first side of the first solar cell comprises:
applying the bonding agent around a rim of a surface on the first side of the first solar cell but not on an entirety of the surface on the first side of the first solar cell.

4. The method of claim 1, wherein the bonding agent comprises an ink.

5. The method of claim 1, wherein attaching the first side of the first solar cell to the first side of the second solar cell comprises:
heating the first solar cell, the second solar cell, and the bonding agent.

6. The method of claim 1, wherein singulating the plating assembly to separate the first solar cell from the second solar cell comprises:
heating the plating assembly.

7. The method of claim 1, wherein the first side of the first solar cell is a front side of the first solar cell and the first side of the second solar cell is a front side of the second solar cell.

8. The method of claim 1, further comprising:
etching the second side of the first solar cell and the second side of the second solar cell to form metal contact fingers.

9. The method of claim 8, wherein the metal contact fingers are interdigitated.

10. The method of claim 1, wherein the metal comprises copper.

11. A method of forming electrodes of solar cells, the method comprising:
forming a plating assembly by attaching a first solar cell to a second solar cell;
attaching the plating assembly to a belt of a plating tool;
moving the belt of the plating tool to transport the plating assembly through a plating chamber and electroplate metal on the first solar cell and on the second solar cell of the plating assembly; and
separating the first solar cell from the second solar cell.

12. The method of claim 11, wherein attaching the first solar cell to the second solar cell comprises:
bonding the first solar cell to the second solar cell by a bonding agent.

13. The method of claim 12, wherein the bonding agent bonds a front side of the first solar cell to a front side of the second solar cell.

14. The method of claim 11, further comprising forming metal contact fingers on the first solar cell and on the second solar cell.

15. The method of claim 14, wherein the metal contact fingers are formed before separating the first solar cell from the second solar cell.

16. The method of claim 11, wherein attaching the plating assembly to the belt of the plating tool comprises:
holding the plating assembly by a clip that is attached to the belt of the plating tool.

* * * * *